United States Patent
Telser et al.

(10) Patent No.: US 6,368,772 B1
(45) Date of Patent: Apr. 9, 2002

(54) PREPARATION OF CROSSLINKABLE WATER-SOLUBLE OR WATER-DISPERSIBLE COMPOSITIONS AND RADIATION-SENSITIVE MIXTURES OBTAINABLE THEREFROM

(75) Inventors: Thomas Telser, Weinheim; Uwe Stebani, Flörsheim-Dalsheim; Alfred Leinenbach, Gönnheim; Markus Tönnessen, Ludwigshafen, all of (DE)

(73) Assignee: BASF Drucksytems GmbH, Stuttgart (DE)

( * ) Notice: Subject to any disclaimer, the term of this patent is extended or adjusted under 35 U.S.C. 154(b) by 0 days.

(21) Appl. No.: 09/324,713

(22) Filed: Jun. 3, 1999

(30) Foreign Application Priority Data

Jun. 3, 1998 (DE) .......................... 198 24 546

(51) Int. Cl.$^7$ ................................. G03C 1/73
(52) U.S. Cl. ................. 430/281.1; 430/283.1; 430/285.1; 430/287.1; 522/76; 522/79; 522/21; 525/59; 525/61
(58) Field of Search .......................... 430/270.1, 281.1, 430/927, 909, 913, 916, 285.1, 283.1, 287.1; 525/61; 522/76, 79, 121, 59, 61

(56) References Cited

U.S. PATENT DOCUMENTS

| | | | | |
|---|---|---|---|---|
| 3,860,425 A | * | 1/1975 | Ono et al. ...................... 96/82 |
| 4,276,366 A | * | 6/1981 | McCartin et al. ........... 430/291 |
| 4,361,640 A | | 11/1982 | Pine et al. |
| 4,387,157 A | | 6/1983 | Bronstert et al. |
| 4,429,034 A | * | 1/1984 | Keane et al. ................ 430/271 |
| 4,537,854 A | * | 8/1985 | Crivello ....................... 430/283 |
| 4,540,743 A | * | 9/1985 | Schulz et al. ................. 525/61 |
| 4,554,240 A | * | 11/1985 | Schulz et al. ............... 430/285 |
| 4,715,277 A | | 12/1987 | Hori |
| 4,725,524 A | * | 2/1988 | Elzer et al. .................. 430/258 |
| 4,942,102 A | * | 7/1990 | Keys et al. .................. 430/281 |
| 4,963,471 A | * | 10/1990 | Trout et al. .................. 430/282 |
| 5,108,798 A | * | 4/1992 | Guerro et al. ............ 427/389.8 |
| 5,112,743 A | * | 5/1992 | Kamiya et al. .............. 430/281 |
| 5,177,056 A | * | 1/1993 | Hilti et al. ....................... 505/1 |
| 5,230,989 A | * | 7/1993 | Urabe et al. ................. 430/303 |
| 5,468,596 A | * | 11/1995 | Loerzer et al. .............. 430/259 |
| 5,591,354 A | * | 1/1997 | Patel et al. ..................... 216/83 |
| 5,919,596 A | * | 7/1999 | Hedrick et al. ........... 430/270.1 |

FOREIGN PATENT DOCUMENTS

| | | |
|---|---|---|
| EP | 224 164 | 6/1987 |
| EP | 670 521 | 9/1995 |
| WO | 96/18133 | 6/1996 |

OTHER PUBLICATIONS

Ullmann's Encyclopedia of Ind. Chem. fifth, vol. 13, 629.

* cited by examiner

Primary Examiner—Janet Baxter
Assistant Examiner—Yvette M. Clarke
(74) Attorney, Agent, or Firm—Keil & Weinkauf

(57) ABSTRACT

Process for functionalizing a water-soluble or water-dispersible polymeric organic binder, in which unmodified, water-soluble or water-dispersible polymeric organic binders are reacted with one or more polar aprotic swelling agents which are compatible with the binder, with thorough mixing with one or more compounds which have groups capable of free radical polymerization, compositions obtainable thereby and radiation-sensitive mixtures which contain, as essential components, the above composition, at least one photopolymerization initiator, if required one or more ethylenically unsaturated, photopolymerizable low molecular weight compounds which are compatible with the polymeric binder and further conventional additives and/or assistants, and radiation-sensitive letterpress or relief printing plates which can be produced therefrom.

14 Claims, No Drawings

PREPARATION OF CROSSLINKABLE WATER-SOLUBLE OR WATER-DISPERSIBLE COMPOSITIONS AND RADIATION-SENSITIVE MIXTURES OBTAINABLE THEREFROM

The present invention relates to a process for functionalizing a water-soluble or water-dispersible polymeric binder, in which an unmodified, water-soluble or water-dispersible polymeric binder is reacted with one or more polar aprotic swelling agents which are compatible with the binder, with thorough mixing with one or more compounds which have groups capable of free radical polymerization.

It furthermore relates to a composition which essentially contains a water-soluble or water-dispersible polymeric organic binder having groups capable of free radical polymerization and a polar, aprotic swelling agent, and a radiation-sensitive mixture which contains, as essential components, said composition, at least one photopolymerization initiator, if required one or more ethylenically unsaturated, photopolymerizable low molecular weight compounds, compatible with the polymeric binder, and further conventional additives and/or assistants. It also relates to radiation-sensitive letterpress or relief printing plates which can be produced from said radiation-sensitive mixture.

Photosensitive photopolymeric recording materials from which printing plates can be produced have to meet a wide range of requirements. For example, the recording materials should have high photosensitivity in order to ensure crisp reproduction of the film. The exposed recording materials should have high mechanical strength in order to withstand long print runs without damage, in particular in letterpress and gravure printing applications.

Photosensitive recording materials based on polymers and monomers which can be washed out with water for the production of printing plates and relief plates are in principle known and are disclosed, for example, in U.S. Pat. No. 4,361,640, EP-A-079 514 or EP-A-224 164.

It is known that the polymeric binder used for letterpress printing plates which can be developed in an aqueous medium may comprise various types of polyvinyl alcohol, which are mixed with suitable monomers, photoinitiator and stabilizer and are cast from solution to give photosensitive recording materials.

Owing to the polarity of polyvinyl alcohol, such recording materials can, after imagewise exposure, be washed out in a short time in water or aqueous solution. In order to achieve sufficient photosensitivity, however, large amounts of photopolymerizable monomers, for example mono-, bi- or polyfunctional acrylates or acrylamides, have to be added to the polyvinyl alcohol. Such monomers are expensive, generally have an irritant effect on the skin and have an unpleasant odor. Furthermore, recording materials obtained from polyvinyl alcohol, monomers and photoinitiator have insufficient mechanical cohesion, which can lead to damage, for example cracks or scratches, during printing.

It has therefore been proposed to use functionalized polyvinyl alcohols in which some of the hydroxyl groups have been reacted with an agent containing double bonds. Photosensitive recording materials having functionalized polyvinyl alcohol as the polymeric binder have the advantage that less monomers have to be added for their crosslinking, shorter exposure times are required and the mechanical resistance is substantially improved compared with recording materials containing unmodified polyvinyl alcohol.

The functionalization of polyvinyl alcohol can be carried out by reacting the hydroxyl group with unsaturated glycidyl compounds, such as glycidyl methacrylate, with unsaturated anhydrides, for example methacrylic anhydride or maleic anhydride, or with unsaturated acids. In carrying out the reaction, however, the problem arises that polyvinyl alcohols are soluble only in protic solvents, such as water, ethanol or propanol. However, since the stated agents react more rapidly with alcohols or water than the hydroxyl groups of the polyvinyl alcohol, a polymer-analogous reaction in solution cannot be realized.

EP-A-670 521 proposes carrying out the reaction in the melt. However, this procedure is disadvantageous since polyvinyl alcohol does not melt until about 200° C. in the absence of additives, and elimination of water may already have occurred. The agents containing double bonds also tend to decompose at 200° C. Before further processing, the modified polymers obtained must therefore first be purified by reprecipitation from a mixture of water and organic solvents.

WO 96/18133 describes a process in which polyvinyl alcohol in aqueous solution is reacted with unsaturated aldehydes or their acetals. Since the reaction is an acid-catalyzed equilibrium reaction, acid must be added to the reaction mixture or the mixture must be passed over an acidic ion exchanger. Furthermore, few unsaturated compounds having an aldehyde or acetal function are commercially available economically.

EP-A-079 514, DE-A-33 22 993 and DE-A-33 22 994 describe a process in which polyvinyl alcohol, after suspension in toluene or halogenated hydrocarbons, is subjected to a heterogeneous reaction with methacrylic anhydride. The disadvantage of this process is that the organic solvent required for suspending has to be removed in an expensive procedure after the reaction is complete, since even small residual amounts of the organic solvents adversely affect the transparency of the recording materials. Since the reaction is carried out in the heterogeneous phase, it is furthermore difficult to achieve homogeneous functionalization.

It is an object of the present invention to provide a simple and economical process for functionalizing a water-soluble or water-dispersible polymeric binder and, from the compositions thus obtainable, to provide improved photosensitive recording materials which are used for the production of letterpress printing plates, coating materials for screen printing and film primers. The invention also relates to the novel compositions containing polar, aprotic swelling agents, radiation-sensitive mixtures and letterpress printing plates containing them.

We have found that this object is achieved by a process for functionalizing a water-soluble or water-dispersible polymeric organic binder, in which an unmodified, water-soluble or water-dispersible polymeric binder is reacted with one or more polar aprotic swelling agents which are compatible with the binder, with thorough mixing with one or more compounds which have groups capable of free radical polymerization.

Surprisingly, it has been found that the resulting composition comprising a water-soluble or water-dispersible polymeric organic binder having groups capable of free radical polymerization and polar, aprotic swelling agents is very useful for the preparation of radiation-sensitive mixtures, without separating off the swelling agent and without further purification.

The radiation-sensitive mixture found contains, as essential components, the above composition, at least one photopolymerization initiator and, if required, further conventional additives and/or assistants. Furthermore, one or more ethylenically unsaturated, photopolymerizable low molecular weight or oligomeric compounds compatible with the polymeric binder and/or further water-soluble or water-dispersible binders may be present. Finally, we have found letterpress or relief printing plates which can be produced from said radiation-sensitive mixture.

The unmodified water-soluble or water-dispersible polymeric binders used as starting material are preferably polyvinyl alcohol or polyvinyl alcohol copolymers. For the purposes of the present invention, the term polyvinyl alcohol is intended to be understood below as meaning partially hydrolyzed polyvinyl acetates in which more than 50% of the acetate groups have been hydrolyzed. The degree of hydrolysis is determined on the one hand by the condition of water solubility or water dispersibility and on the other hand by the desired conversion or degree of functionalization. Preferably, the degree of hydrolysis is 72–92%, very particularly preferably 80–88%. The average degree of polymerization is preferably from 350 to 2500 and is chosen according to the intended use by a person skilled in the art in this area. It is also possible to use copolymers which, in addition to vinyl alcohol or vinyl acetate units, contain other monomer units. Particularly suitable comonomers are α-olefins, such as ethylene or propylene, vinyl compounds, such as acrylic acid, methacrylic acid or their esters, vinylamine or amides, such as N-vinylpyrrolidone and vinylformamide. Graft copolymers having a side chain of polyvinyl alcohol and a main chain, for example of polyethylene oxide, may also be used. Examples are the binders disclosed in EP-A-224 164.

The type and amount of comonomers is limited only in that the copolymers still have to be water-soluble or water-dispersible. Mixtures of polyvinyl alcohols or polyvinyl alcohol copolymers having different degrees of polymerization and/or degrees of hydrolysis may also be used.

Furthermore, water-soluble or water-dispersible polymeric binders having carboxyl groups, for example polyacrylic acid and polymethacrylic acid and copolymers of said acids, may be used.

Polymers having amine units or copolymers thereof may also be used, for example polyvinylamine and vinylamine/vinylformamide copolymers.

The swelling agents used are polar, aprotic solvents. The choice is limited only in that they have to be compatible with the polymers used, i.e. they are absorbed by the polymer granules or polymer powder and lead to an increase in volume (swelling) of the individual solid particles. Organic carbonates $R_1O(CO)OR_2$, where $R_1$ and $R_2$ are each straight-chain or branched alkyl which may furthermore carry inert substituents, e.g. chlorine or bromine, are preferred. Particularly suitable carbonates are those of 1 to 6 carbon atoms. $R_1$ and $R_2$ may also be bonded to one another to form a ring, for example having 5 or 6 members. Ethylene carbonate, propylene carbonate, butylene carbonate and dimethyl carbonate are particularly preferred. Mixtures of different carbonates may also be used.

Also preferred are organic phosphates $R_1R_2R_3PO_4$, where $R_1, R_2$ and $R_3$ are each straight-chain or branched alkyl of 1 to 8 carbon atoms which may also be further substituted. $R_1$, $R_2$ and $R_3$ may also be bonded to one another in pairs to form a ring. Mixtures of different phosphates may also be used. Tris(2-ethylhexyl) phosphate is particularly preferred for cost reasons. Mixtures of the organic carbonates and phosphates described may also be used.

For functionalization, the unmodified water-soluble or water-dispersible polymeric binders are reacted with low molecular weight compounds which have both crosslinkable groups and groups which can react with above polymers. Such compounds and such functionalization reactions are known in principle, for example from EP-A-079 514. For example, acylating agents which contain incorporated groups capable of free radical polymerization and which react with hydroxyl or amino groups of above polymers may be used. Suitable acylating agents are the conventional classes of compounds usually used for acylation reactions, for example carboxylates, carbonyl halides and in particular carboxylic anhydrides. The groups contained in the acylating agents and capable of free radical polymerization are usually polymerizable ethylenic double bonds which are preferably activated, i.e. are in conjugation with other double bonds or have neighboring oxygen or nitrogen atoms. Acylating agents which are derived from maleic acid, acrylic acid or methacrylic acid are therefore particularly advantageous, especially acrylic anhydride and methacrylic anhydride. Mixtures of different acylating agents may also be used.

Also suitable are, for example, epoxides which additionally contain groups capable of free radical polymerization, such as glycidyl acrylate and glycidyl methacrylate, which preferably react with carboxyl groups of above polymers.

The present invention also relates to the functionalization by a two-stage reaction by reacting, for example, the hydroxyl groups of abovementioned polymers first with a cyclic carboxylic anhydride and reacting the resulting, carboxyl-containing polymer further with glycidyl acrylate. Particularly suitable cyclic carboxylic anhydrides are succinic anhydride, glutaric anhydride and phthalic anhydrides.

The reaction can be carried out without further catalysis. However, it can also be accelerated by adding catalysts known per se, e.g. methylimidazole or aminopyridine derivatives, which are disclosed in DE-A-33 22 993 and DE-A-33 22 994.

For stabilization to prevent thermal crosslinking, stabilizers known per se may be added to the polyvinyl alcohol. For example, hydroquinone derivatives, sterically hindered phenol derivatives and salts of xyligen are suitable. The stabilizer may be added before or after functionalization has been carried out.

The reaction of the unmodified water-soluble or water-dispersible polymeric binders with the functionalizing agents is carried out by adding the polar, aprotic swelling agent, the functionalizing agents and, if required, further conventional additives or assistants, for example catalysts or stabilizers, to the polymeric binder and effecting the reaction with vigorous mixing. The swelling agent can be added before or simultaneously with the functionalizing agents and, if required, additives and assistants. In principle, any desired amount of the swelling agent used can be chosen. In a preferred embodiment of the present invention, however, very little swelling agent is used, so that a free-flowing product is formed. The amount of swelling agent is preferably 10–50, very particularly preferably 10–25, % by weight, based on all components of the mixture. The amount of added functionalizing agent depends on the desired degree of functionalization. When choosing the degree of functionalization, it is merely necessary to take into account that the water solubility or the water dispersibility of the functionalized polymeric binder must be ensured. A person skilled in the art in this area knows which degrees of functionalization are required for a specific desired application. The reaction is carried out as a rule with heating. The temperature is chosen so that a possible polymerization of the functionalizing agents is very substantially avoided. As a rule, 150° C. is therefore not exceeded. The reaction temperature is preferably from 60 to 120° C.

The reaction time, which depends on the desired degree of functionalization, is usually 1–20 h, preferably 1–6 h.

No special apparatuses are required for carrying out the reaction. Very thorough mixing of the reaction mixture is of course ensured. The procedure can be carried out in simple stirred kettles having stirrers of adequate efficiency, in heatable mixers or kneading apparatuses.

The process described leads to very uniform functionalization. The uniformity of the functionalization can be determined by a person skilled in the art, for example by means of Raman mapping.

The composition thus obtained contains preferably 50–90% by weight, based on the sum of all components, of a water-soluble or water-dispersible polymeric organic binder having groups capable of free radical polymerization and 10–50% by weight of the polar, aprotic swelling agent which is compatible with the binder. The composition may furthermore contain assistants, for example catalysts or stabilizers, in small amounts. It may furthermore contain unreacted functionalizing agent as well as byproducts, such as components of the functionalizing agent which are eliminated in the course of the reaction. An example of this is methacrylic acid, which remains in the composition in the reaction of methacrylic anhydride with polyvinyl alcohol. The amount of all further components is preferably not more than 15% by weight, based on the sum of all components.

The composition is preferably free-flowing, which greatly simplifies the handling of the product.

Surprisingly, it was found that the novel composition is very useful, without further purification, for the preparation of radiation-sensitive recording materials.

For the purposes of this description, radiation-sensitive is to be understood as meaning any mixture or layer which is permanently changed in its properties, in particular in its solubility, by actinic, i.e. chemically active, radiation. Preferably used radiation of this type is short-wave visible or long-wave ultraviolet light. Of course, any radiation of higher energy, such as short-wave UV light, electron radiation, X-rays or γ radiation, or, with suitable sensitization, also light of longer wavelength is also suitable.

An essential feature of the novel, radiation-sensitive mixture is the content of the novel composition defined above.

Suitable photoinitiators or photoinitiator systems are those customary for radiation-sensitive recording materials, for example free radical photoinitiators, such as benzoin or benzoin derivatives, symmetrically or asymmetrically substituted benzil ketals, such as benzil dimethyl ketal or benzil 1-methyl 1-ethyl ketal, diarylphosphine oxides, such as 2,4,6-trimethylbenzoyldiphenylphosphine oxide or 2,6-dimethoxy-benzoyldiphenylphosphine oxide, ethyl 2,4,6-trimethyl-benzoylphenylphosphinate or acyldiarylphosphine oxides, diacylphosphine oxides or substituted and unsubstituted quinones, such as ethylanthraquinone, benzanthraquinone, benzophenone or 4,4'-bis(dimethylamino)benzophenone. They may be used alone or as a mixture with coinitiators, for example ethylanthraquinone with 4,4'-bis(dimethylamino)benzophenone or diacylphosphine oxides with tertiary amines.

The photoinitiators are usually contained in the radiation-sensitive mixture in amounts from 0.1 to 10, preferably from 0.2 to 5, % by weight, based on the sum of all components.

In addition to the novel composition and photoinitiators, the radiation-sensitive mixture may contain further assistants and additives, for example suitable dyes, pigments or photochromic additives in an amount of 0.0001–2% by weight. They serve for controlling the exposure properties, for identification, for direct monitoring of the exposure result or for esthetic purposes. A precondition for the choice is that they do not interfere with the photopolymerization of the mixtures. For example, the soluble phenazinium, phenoxazinium, acridinium and phenothiazinium dyes, such as Neutral Red (C.I. 50040), Safranine T (C.I. 50240), Rhodanil Blue, the salt or amide of Rhodamine D (Basic Violet 10, C.I 45170), Methylene Blue B (C.I. 52015) or Solvent Black 3 (C.I. 26150), are suitable. These dyes can also be used together with a sufficient amount of a reducing agent which does not reduce the dye in the absence of actinic light but can reduce the dye in the excited electronic state on exposure. Examples of such mild reducing agents are ascorbic acid, anethole, thioureas or hydroxylamine derivatives, in particular salts of N-nitroso-cyclohexylhydroxylamine, preferably the potassium, calcium and aluminum salts. The addition of from 3 to 10 times the amount of dye has proven useful in many cases.

A particular advantage of the novel radiation-sensitive mixture is that no additional photopolymerizable, ethylenically unsaturated low molecular weight or oligomeric compounds have to be added for crosslinking. Excellent results are obtained even without these additives. However, the present invention relates equally to radiation-sensitive mixtures which additionally contain photopolymerizable ethylenically unsaturated low molecular weight or oligomeric compounds. Suitable compounds are those which are conventional and commonly used photosensitive recording materials of the type under discussion and are described, for example, in the literature cited at the outset. The photopolymerizable compounds may contain one or more ethylenically unsaturated double bonds. The choice of the type and amount depends on the one hand on the intended use of the photosensitive composition, for example on the desired hardness of the relief plates formed therefrom, and on the other hand on the compatibility with the polymeric binder and on the requirement for developability with water. Examples of preferred compounds are those having hydroxyl groups, amido groups or polyethylene glycol structural units. Mono- and polyacrylates and/or -methacrylates of monohydric and polyhydric low molecular weight alcohols are also very suitable. For example, (meth)acrylates of alkanols of 1 to 20 carbon atoms, such as methyl methacrylate, ethyl acrylate, propyl (meth)acrylate and isopropyl (meth)acrylate, (meth)acrylates of polyhydric alcohols of 2 to 20 carbon atoms, e.g. 2-hydroxyethyl (meth)acrylate, 2-hydroxypropyl (meth)acrylate, ethylene glycol di(meth)acrylate, butanediol di(meth)acrylate or 1,1,1-trimethylolpropane tri(meth)acrylate, and furthermore polyethylene glycol mono(meth)acrylate monomethyl ether and 2-diethylaminoethyl acrylate may be used. Epoxy- and urethane(meth)acrylates, as obtained, for example, by reacting bisphenol A diglycidyl ether with (meth)acrylic acid or by reacting mono- or diisocyanates with hydroxyalkyl (meth)acrylates and, if required, with hydroxyl-containing polyesters or polyethers, are also suitable. Derivatives of acrylamide and of methacrylamide, for example ethers of their N-methylol derivatives with monohydric or polyhydric alcohols, e.g. ethylene glycol, glycerol, 1,1,1-trimethylolpropane or oligomeric or polymeric ethylene oxide derivatives, are also suitable.

The ratio of the novel composition to the additional photopolymerizable, ethylenically unsaturated low molecular weight or oligomeric compounds in the radiation-sensitive mixture can be varied within a wide range.

However, at most small amounts of up to 15% by weight are preferably added.

The radiation-sensitive composition may furthermore contain additional unmodified water-soluble or water-dispersible binders. The abovementioned unmodified polymers are suitable.

The preparation of the radiation-sensitive mixture from the individual components can be carried out in the conventional manner by mixing the components with or without a solvent with the aid of known mixing methods and by processing this mixture to give the radiation-sensitive layer with the aid of known techniques, such as casting from solution, calendering or extrusion, it also being possible to combine these measures with one another in a suitable manner. The preferred method comprises stirring the components in water or in an aqueous solvent system to give a homogeneous solution which can be cast on a substrate. The thickness of the layer is expediently about 0.1–2 mm, in particular 0.2–1 mm.

The radiation-sensitive composition can be used, for example, for the production of letterpress or relief printing plates, of coating materials for screen printing or of film primers, i.e. compositions for the pretreatment of inkjet films to ensure their printability with water-based inks.

In the case of the novel letterpress plate, the radiation-sensitive layer is applied to a dimensionally stable substrate, if necessary by means of an adhesion-promoting layer. Examples of suitable dimensionally stable substrates are sheets, films and conical and cylindrical sleeves of metals, such as steel, aluminum, copper or nickel, or of plastic, such as polyethylene terephthalate (PET), polybutylene terephthalate, polyamide or polycarbonate, if required also as woven fabrics and nonwovens, such as glass fiber fabrics, and laminates of glass fibers and plastics.

Inter alia, polyurethane adhesive coats, for example according to DE-A-30 45 516, based on polyisocyanate-crosslinking polyether or polyester coats in coat thicknesses of from 0.5 to 50 µm, in particular from 2 to 30 µm, may serve as adhesion-promoting layers.

Topcoats may be present on that side of the adhesion-promoting layer which faces away from the substrate layer, have layer thicknesses of from 0.1 to 50, in particular from 1 to 10 µm, and can be obtained, for example, from dilute aqueous/alcoholic solution of partly hydrolyzed polyvinyl esters, phenyl glyceryl ether monoacrylate and glyoxal by coating, drying and baking.

A release layer of a water-soluble or water-dispersible polymer may be present on the radiation-sensitive layer and is required whenever the photopolymerizable layer present underneath and developable with water or an aqueous/alcoholic medium is so tacky that, when the photographic negative is placed on top, the air present cannot be uniformly removed and as a result vacuum defects form during exposure, or that the negative can no longer be cleanly separated from the layer surface.

The photopolymerizable layer can be protected from mechanical damage by a protective film, which is present either on the photographic layer or on the release layer (cf. for example Ullmanns Encyclopedia of Industrial Chemistry, volume A 13, page 629).

For the development of the novel letterpress printing plate, the layer crosslinkable by actinic light can be exposed to the UV light sources customary for photopolymer printing plates (main emission range 320–400 nm). The washing out of unexposed parts of photopolymer printing plates with water or aqueous solvent systems, washing and preliminary drying can be carried out using the washout systems commercially available for this purpose.

The examples which follow illustrate the invention without restricting the scope of the invention. The polyvinyl alcohols are characterized as usual by the degree of hydrolysis and the viscosity of a 4% strength solution in water at 20° C.

Preparation of the Novel Compositions

EXAMPLE 1

A mixture of 80 parts by weight of propylene carbonate, 80 parts by weight of ethylene carbonate, 128 parts by weight of methacrylic anhydride, 9 parts by weight of an esterification catalyst (methylimidazole) and 3 parts by weight of 2,6-di-tert-butylcresol as a heat stabilizer (Kerobits® TBK from BASF, Germany) is added to 800 parts by weight of polyvinyl alcohol granules (degree of hydrolysis 82%, viscosity: 5 mPa.s, Poval 405 from Kuraray, Japan) in a vessel with thorough mixing by means of a powerful stirrer. The mixture is then stirred at 85° C. for 5 hours. After this time, free-flowing granules which consist of a functionalized polyvinyl alcohol, the swelling agents, catalyst, stabilizer and methacrylic acid are obtained.

EXAMPLE 2

A mixture of 600 parts by weight of propylene carbonate, 100 parts by weight of methacrylic anhydride, 6 parts by weight of an esterification catalyst (methylimidazole) and 3 parts by weight of 2,6-di-tert-butylcresol as a heat stabilizer is added to 800 parts by weight of polyvinyl alcohol granules (degree of hydrolysis 72%, viscosity: 5 mPa.s, Alcotex® 72.5 from Harco, UK) in a mixer with thorough mixing. The mixture is then mixed at 85° C. for 4 hours. After this time, granules which consist of a functionalized polyvinyl alcohol, the swelling agent, catalyst, stabilizer and methacrylic acid are obtained.

EXAMPLE 3

A mixture of 100 parts by weight of propylene carbonate, 100 parts by weight of ethylene carbonate, 200 parts by weight of methacrylic anhydride, 10 parts by weight of an esterification catalyst (methylimidazole) and 3 parts by weight of 2,6-di-tert-butylcresol is added to 800 parts by weight of polyvinyl alcohol granules (degree of hydrolysis 92%, viscosity: 30 mPa.s, Mowiol® 30-92 from Clariant, Switzerland) in a mixer/kneader with thorough mixing. The mixture is then stirred at 85° C. for 5 hours. After this time, free-flowing granules which consist of a functionalized polyvinyl alcohol, the swelling agents, catalyst, stabilizer and methacrylic acid are obtained.

EXAMPLE 4

A mixture of 200 parts by weight of dimethyl carbonate, 150 parts by weight of methacrylic anhydride, 10 parts by weight of an esterification catalyst (methylimidazole) and 3 parts by weight of 2,6-di-tert-butylcresol is added to 800 parts by weight of polyvinyl alcohol granules (degree of hydrolysis 82%, viscosity: 5 mpa.s, KP 405 from Kuraray, Japan) in a vessel with thorough mixing by means of a powerful stirrer. The mixture is then stirred at 65° C. for 6 hours. After this time, free-flowing granules which consist of a functionalized polyvinyl alcohol, the swelling agent, catalyst, stabilizer and methacrylic acid are obtained.

EXAMPLE 5

A mixture of 80 parts by weight of propylene carbonate, 100 parts by weight of ethylene carbonate, 148 parts by weight of methacrylic anhydride, 9 parts by weight of an esterification catalyst (methylimidazole) and 3 parts by weight of 2,6-di-tert-butylcresol is added to 800 parts by weight of a terpolymer of vinylpyrrolidone, vinyl acetate and vinyl alcohol (vinylpyrrolidone/vinyl acetate copolymer Luviskol® VA64, partially hydrolyzed, molar ratio about 60% to 25% to 15%) in a tumbler mixer with thorough mixing. The mixture is then stirred at 85° C. for 5 hours. After this time, a free-flowing powder which consists of a functionalized polymer, the swelling agents, catalyst, stabilizer and methacrylic acid is obtained.

EXAMPLE 6

A mixture of 80 parts by weight of ethylene carbonate, 80 parts by weight of propylene carbonate, 148 parts by weight of methacrylic anhydride, 9 parts by weight of an esterification catalyst (methylimidazole) and 3 parts by weight of a heat stabilizer (e.g. Kerobit TBK from BASF, Germany) is added to 400 parts by weight of polyvinyl alcohol granules (degree of hydrolysis 82%, viscosity: 5 mpa.s, KP 405 from Kuraray, Japan) and 400 parts by weight of a polyvinyl alcohol/polyethylene glycol copolymer (degree of hydrolysis 97%, viscosity: 5 mpa.s, Mowiol® GE 05-97, formerly Hoechst AG, Germany) in a vessel with thorough mixing by means of a powerful stirrer. The mixture is then stirred at 85° C. for 5 hours. After this time, free-flowing granules which consist of a mixture of functionalized polyvinyl alcohols, the swelling agents, catalyst, stabilizer and methacrylic acid are obtained.

EXAMPLE 7

A mixture of 100 parts by weight of propylene carbonate, 100 parts by weight of ethylene carbonate, 100 parts by weight of glycidyl methacrylate, 8 parts by weight of a catalyst (e.g. methylimidazole) and 3 parts by weight of a heat stabilizer (e.g. Kerobit TBK from BASF, Germany) is added to 800 parts by weight of a polyacrylic acid powder ($M_w$: 20,000 g/mol, from BASF, Germany) in a tumbler mixer with thorough mixing. The mixture is then stirred at 85° C. for 5 hours. After this time, a powder which consists of a functionalized polyacrylic acid, the swelling agent and methacrylic acid is obtained.

Comparative Example 1

A mixture of 160 parts by weight of methacrylic anhydride, 8 parts by weight of an esterification catalyst (methylimidazole) and 3 parts by weight of a heat stabilizer (e.g. Kerobit TBK from BASF, Germany) is added to 800 parts by weight of polyvinyl alcohol granules (degree of hydrolysis 82%, viscosity 5 mPa.s, KP 405 from Kuraray, Japan) in a vessel with thorough mixing by means of a powerful stirrer. The mixture is then stirred at 85° C. for 5 hours. After this time, free-flowing granules which consist of a functionalized polyvinyl alcohol, catalyst, stabilizer and methacrylic acid are obtained.

Comparative Example 2

The preparation of the modified polyvinyl alcohol was carried out according to DE-A-33 22 994. For this purpose, 50 parts by weight of a partially hydrolyzed polyvinyl acetate (degree of hydrolysis 82 mol %, average molecular weight 30,000) were suspended in 150 parts by weight of toluene, and 8 parts by weight of methacrylic anhydride, 0.4 part by weight of methylimidazole and 0.05 part by weight of Kerobit TBK were then added. The inhomogeneous reaction mixture was stirred for 5 hours at 85° C., after which the reaction product was separated off, washed with toluene and dried at 50° C. for 12 hours in a drying oven.

Preparation of radiation-sensitive mixtures, radiation-sensitive letterpress printing plates and letterpress printing plates produced therefrom.

EXAMPLES 8 TO 13

For the production of photopolymerizable printing plates, the following procedure is adopted using the mixtures, obtained according to Examples 1 to 6, of the respective functionalized polymers, swelling agents, catalyst, stabilizer and methacrylic acid.

470 parts by weight of the respective mixture are stirred in a mixture of 318 parts by weight of water and 212 parts by weight of n-propanol at 85° C. until a homogeneous solution has formed. Thereafter, 18 parts by weight of benzil dimethyl ketal and 3 parts by weight of the potassium salt of N-nitroso-cyclohexylhydroxylamine are added and the mixture is stirred at 85° C. until a homogeneous solution has formed. This solution is then cast on a 120 μm thick film of biaxially oriented and heat-set polyethylene terephthalate so that, after drying, a 540 μm thick photosensitive layer is obtained.

A 250 μm thick polyethylene terephthalate film coated in a thickness of 10 μm with adhesion-promoting polyurethane coat comprising polyisocyanate-crosslinked polyether is laminated with a photosensitive layer and the resulting photosensitive printing plate having a total thickness of 920 μm is dried for 3 hours at 60° C. in a drying oven. The photosensitive printing plate is exposed through a test negative in a commercial UV vacuum exposure unit of size 80×107 cm (e.g. nyloprint® exposure unit 80×107) and developed with water in a commercial washout unit (nyloprint® washout system DW 85). Ready-to-print flexible letterpress printing plates having very good shadow well depths and excellent resistance to cracking and giving crisp copies are obtained.

Table 1 shows the measured data obtained with the letterpress printing plates produced according to the invention.

EXAMPLE 14

329 parts by weight of the mixture prepared according to Example 1 are stirred together with 94 parts by weight of a partially hydrolyzed polyvinyl alcohol (Poval® KP 405 from Kuraray, Japan) and 47 parts by weight of a phenyl glycidyl ether acrylate (Laromer® 8830 from BASF AG, Germany) in a mixture of 318 parts by weight of water and 212 parts by weight of n-propanol at 85° C. until a homogeneous solution has formed. Thereafter, 18 parts by weight of benzil dimethyl ketal and 3 parts by weight of the potassium salt of N-nitroso-cyclohexylhydroxylamine are added and the mixture is stirred at 85° C. until a homogeneous solution has formed. This solution is then cast on a 120 μm thick film of biaxially oriented and heat-set polyethylene terephthalate so that, after drying, a 540 μm thick photosensitive layer is obtained.

For the production of the printing plate, the procedure described in Examples 8–13 is followed.

EXAMPLE 15

80 parts by weight of the mixture prepared according to Example 7 are stirred together with 240 parts by weight of a partially hydrolyzed polyvinyl alcohol (Poval® KP 405 from Kuraray, Japan) and 120 parts by weight of a phenyl glycidyl ether acrylate (Laromer® 8830 from BASF AG, Germany) in a mixture of 360 parts by weight of water and 200 parts by weight of n-propanol at 85° C. until a homogeneous solution is formed. Thereafter, 18 parts by weight of benzil dimethyl ketal and 3 parts by weight of the potassium salt of N-nitrosocyclohexylhydroxylamine are added and the mixture is stirred at 85° C. until a homogeneous solution has formed. This solution is then cast on a 120 μm thick film of biaxially oriented and heat-set polyethylene terephthalate so that, after drying, a 540 μm thick photosensitive layer has formed.

For the production of the printing plate, the procedure described in Examples 8–13 is followed.

Comparative Example 3

470 parts by weight of the mixture prepared according to Comparative Example 1 are stirred in a mixture of 318 parts by weight of water and 212 parts by weight of n-propanol at 85° C. Even after a dissolution time of about 10 hours, gel-like constituents remain in the mixture, so that it is not possible to prepare a homogeneous solution suitable for the production of printing plates.

Comparative Example 4

470 parts by weight of the mixture of Comparative Example 2 are stirred in a mixture of 318 parts by weight of water and 212 parts by weight of n-propanol at 85° C. until a homogeneous solution has formed. Thereafter, 18 parts by weight of benzil dimethyl ketal, 3 parts by weight of the potassium salt of N-nitroso-cyclohexylhydroxylamine and 0.03 part by weight of Safranine T (C.I. 50240) are added and the mixture is stirred at 85° C. until a homogeneous solution has formed. This solution is then cast on a 120 μm thick film of biaxially oriented and heat-set polyethylene terephthalate so that, after drying, a 540 μm thick photosensitive layer is obtained.

For the production of the printing plate, the procedure described in Examples 8–13 is followed.

The evaluation of the exposed and developed printing plate was carried out optically by means of a stereomicroscope and image analyzer. The printing properties were assessed visually by producing proofs from test plates with a DIN A 4 motif.

Preparation of the novel compositions with organic phosphates as swelling agents.

EXAMPLE 16

A mixture of 80 parts by weight of tris(2-ethylhexyl) phosphate, 148 parts by weight of methacrylic anhydride, 9 parts by weight of an esterification catalyst (methylimidazole) and 3 parts by weight of a heat stabilizer (e.g. Kerobit TBK from BASF, Germany) are added to 800 parts by weight of polyvinyl alcohol granules (degree of hydrolysis 82%, viscosity 5 mPa.s, KP 405 from Kuraray, Japan) in a vessel with thorough mixing by means of a powerful stirrer. The mixture is then stirred for 5 hours at 85° C. After this time, free-flowing granules which consist of a mixture of functionalized polyvinyl alcohol, the swelling agent, catalyst, stabilizer and methacrylic acid are obtained.

EXAMPLE 17

A mixture of 80 parts by weight of tris(butoxyethyl) phosphate, 148 parts by weight of methacrylic anhydride, 9 parts by weight of an esterification catalyst (methylimidazole) and 3 parts by weight of a heat stabilizer (e.g. Kerobit TBK from BASF, Germany) are added to 800 parts by weight of polyvinyl alcohol granules (degree of hydrolysis 82%, viscosity 5 mPa.s, KP 405 from Kuraray, Japan) in a vessel with thorough mixing by means of a powerful stirrer. The mixture is then thoroughly mixed for 5 hours at 85° C. After this time, free-flowing granules which consist of a mixture of functionalized polyvinyl alcohol, the swelling agent, catalyst, stabilizer and methacrylic acid are obtained.

EXAMPLE 18

A mixture of 40 parts by weight of tris(butoxyethyl) phosphate, 128 parts by weight of methacrylic anhydride, 9 parts by weight of an esterification catalyst (methylimidazole) and 3 parts by weight of a heat stabilizer (e.g. Kerobit TBK from BASF, Germany) are added to 800 parts by weight of polyvinyl alcohol granules (degree of hydrolysis 82%, viscosity 5 mpa.s, KP 405 from Kuraray, Japan) in a vessel with thorough mixing by means of a powerful stirrer. The mixture is then thoroughly mixed for hours at 85° C. After this time, free-flowing granules which consist of a mixture of functionalized polyvinyl alcohol, the swelling agent, catalyst, stabilizer and methacrylic acid are obtained.

Preparation of radiation-sensitive mixtures, radiation-sensitive letterpress printing plates, and letterpress printing plates produced therefrom.

EXAMPLES 19 TO 21

For the production of photopolymerizable printing plates, the procedure as in Example 14 is followed using the mixtures obtained according to Examples 16 to 18 and comprising the respective functionalized polymers, the swelling agents, catalyst, stabilizer and methacrylic acid. The procedure as in Examples 8–13 is followed for the production of the printing late.

Table 1 shows the measured data obtained with the novel letterpress printing plates.

TABLE 1

Properties of the printing plates produced

| Example No. | Composition No. | Remarks | Appearance of the layer | Exposure time [min] | Washout time [min] | Shadow well depth 50% screen [μm] | Print broadening [%] | Printing properties |
|---|---|---|---|---|---|---|---|---|
| 8 | 1 | without additional monomer | clear layer | 1.5 | 2.5 | 18 | −13.1 | very good |
| 14 | 1 | with additional monomer | clear, soft layer | 2.0 | 2.0 | 22 | −12.8 | excellent |
| 9 | 2 | without additional monomer | clear layer | 2.0 | 8.5 | 31 | −16.3 | good |

TABLE 1-continued

Properties of the printing plates produced

| Example No. | Composition No. | Remarks | Appearance of the layer | Exposure time [min] | Washout time [min] | Shadow well depth 50% screen [μm] | Print broadening [%] | Printing properties |
|---|---|---|---|---|---|---|---|---|
| 10 | 3 | without additional monomer | clear layer | 1.5 | 4.0 | 20 | −10.0 | very good |
| 11 | 4 | without additional monomer | clear layer | 1.0 | 2.0 | 17 | −11.3 | good |
| 12 | 5 | without additional monomer | clear, hard layer | 2.0 | 1.5 | 25 | −15.9 | good |
| 13 | 6 | without additional monomer | clear, soft layer | 1.0 | 1.5 | 20 | −15.6 | very good |
| 15 | 7 | with additional monomer | slightly turbid layer | 2.5 | 2.0 | 18 | −7.2 | good |
| 19 | 16 | with additional monomer | slightly turbid layer | 3.5 | 3.5 | 15 | −0.1 | satisfactory |
| 20 | 17 | with additional monomer | slightly turbid layer | 2.0 | 4.0 | 20 | −3.8 | good |
| 21 | 18 | with additional monomer | clear layer | 1.0 | 4.0 | 31 | −6.3 | very good |
| C3 | C1 | no swelling agent | no layer | — | — | — | — | — |
| C4 | C2 | toluene as suspending medium, according to DE 33 22 994 | turbid layer | 2.0 | 6.0 | 19 | −1.9 | poor |

Legend for Table 1:
Exposure time: Time required to form a screen with 2% dot area by exposure to UVA light
Washout time: Time required to develop an imagewise exposed printing plate with a suitable solvent
Shadow well depths: Difference in level between surface and base of a printing plate (in this case in a screen with 50% dot area)
Print broadening: Percentage difference between the size of a printing element on the photographic negative and on the printing plate after development (in this case measured on a line having a theoretical width of 160 μm)

We claim:

1. A process for the preparation of solid crosslinkable water-soluble or water-dispersible compositions, which are capable of free radical polymerization, by functionalizing water-soluble or water-dispersible polymeric binders by causing an unmodified water-soluble or water-dispersible polymeric binder selected from the group consisting of polyvinyl alcohol, polyvinyl alcohol copolymer, polyacrylic acid, polyacrylic acid copolymer, polyvinylamine, polyvinylamine copolymer, or a mixture of two or more thereof, to react with one or more compounds which have at least one group capable of reacting with said unmodified binder and at least one free radical polymerizable group in the presence of one or more polar aprotic swelling agents which are compatible with the binder, selected from the group consisting of organic carbonates, organic phosphates or mixtures thereof.

2. A process for the preparation of a composition as claimed in claim 1 wherein the amount of swelling agent is such that the composition remains free-flowing.

3. A radiation sensitive mixture containing
   (a) a composition containing
      (aa) 50–90% by weight of a water-soluble or water dispersible binder having groups capable of free radical polymerization selected from the group consisting of modified polyvinyl alcohol, modified polyvinyl alcohol copolymer, modified polyacrylic acid, modified polyacrylic acid copolymer, modified polyvinylamine, modified polyvinylamine copolymer, or a mixture of two or more thereof, and
      (ab) 10–50% by weight of a polar, aprotic swelling agent which is compatible with the binder (aa), selected from the group consisting of organic carbonates, organic phosphates and mixtures thereof,
   (b) at least one photopolymerization initiator,
   (c) further water-soluble or water dispersible polymeric organic binders and, optionally,
   (d) further conventional additives and/or assistants.

4. A composition as claimed in claim 3, wherein the organic phosphate is tris(2-ethylhexyl)phosphate.

5. A composition as claimed in claim 3, wherein the composition is free-flowing.

6. A process for the production of a radiation sensitive letterpress printing plate, which comprises applying a radiation mixture as claimed in claim 3 to a dimensionally stable substrate.

7. An aqueous solution or dispersion produced by dissolving or dispersing the composition of claim 3 in an aqueous solvent or dispersant.

8. A composition as claimed in claim 3 wherein said water-soluble or water dispersible polymeric organic binder having groups capable of free radical polymerization (a) is a modified polyvinyl alcohol or a modified polyvinyl alcohol copolymer.

9. A radiation sensitive mixture containing
   (a) a composition containing
      (aa) 50–90% by weight of a water-soluble or water dispersible binder having groups capable of free radical polymerization selected from the group consisting of modified polyvinyl alcohol, modified polyvinyl alcohol copolymer, modified polyacrylic acid, modified polyacrylic acid copolymer, modified polyvinylamine, modified polyvinylamine copolymer, or a mixture of two or more thereof, and
      (ab) 10–50% by weight of a polar, aprotic swelling agent which is compatible with the binder (aa), selected from the group consisting of organic carbonates, organic phosphates and mixtures thereof,
   (b) at least one photopolymerization initiator,
   (c) one or more ethylenically unsaturated, photopolymerizable low-molecular weight or oligomeric compound and, optionally,
   (d) further conventional additives and/or assistants.

10. An aqueous solution or dispersion produced by dissolving or dispersing the composition of claim 9 in an aqueous solvent or dispersant.

11. A composition as claimed in claim 9, wherein the organic phosphate is tris(2-ethylhexyl)phosphate.

12. A composition as claimed in claim 9, wherein the composition is free-flowing.

13. A process for the production of a radiation sensitive letterpress printing plate, which comprises applying a radiation sensitive mixture as claimed in claim 9 to a dimensionally stable substrate.

14. A composition as claimed in claim 9 wherein said water-soluble or water dispersible polymeric organic binder having groups capable of free radical polymerization (a) is a modified polyvinyl alcohol or a modified polyvinyl alcohol copolymer.

* * * * *